US011762040B2

(12) United States Patent
Anderson et al.

(10) Patent No.: US 11,762,040 B2
(45) Date of Patent: Sep. 19, 2023

(54) PREDICTING FAILURE AND/OR ESTIMATING REMAINING USEFUL LIFE OF AN AIR-DATA-PROBE HEATER

(71) Applicant: Rosemount Aerospace Inc., Burnsville, MN (US)

(72) Inventors: Kaare Josef Anderson, Farmington, MN (US); Magdi A. Essawy, Lakeville, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 0 days.

(21) Appl. No.: 17/218,060

(22) Filed: Mar. 30, 2021

(65) Prior Publication Data

US 2022/0317202 A1    Oct. 6, 2022

(51) Int. Cl.
  G01R 31/56    (2020.01)
  G01R 31/52    (2020.01)
  (Continued)

(52) U.S. Cl.
  CPC ............ G01R 31/56 (2020.01); G01P 21/025 (2013.01); G01R 31/52 (2020.01); B64D 15/12 (2013.01);
  (Continued)

(58) Field of Classification Search
  CPC ...... G01R 31/52; G01R 31/008; G01R 19/32; G01R 31/50; G01R 31/54; G01R 31/56;
  (Continued)

(56) References Cited

U.S. PATENT DOCUMENTS 5,925,275 A    7/1999 Lawson et al.
6,107,611 A    8/2000 Jones
(Continued)

FOREIGN PATENT DOCUMENTS

EP    3379266 A1    9/2018
GB    2561393 A     10/2018
WO    9011532 A1    10/1990

OTHER PUBLICATIONS

Arief, Y. Z., et al. "Degradation of polymeric power cable due to water treeing under AC and DC stress." 2012 IEEE International Conference on Power and Energy (PECon). IEEE, 2012. (Year: 2012).*

(Continued)

*Primary Examiner* — Yoshihisa Ishizuka
*Assistant Examiner* — Carter W Ferrell
(74) *Attorney, Agent, or Firm* — Kinney & Lange, P.A.

(57) ABSTRACT

Apparatus and associated methods relate to predicting failure and/or estimating remaining useful life of an air-data-probe heater. Failure is predicted or useful life is estimated based on an electrical metric of the electrical operating power provided to a resistive heating element of the air-data-probe heater. The electrical metric of the air data probe heater is one or more of: i) phase relation between voltage across the resistive heating element and leakage current, which is conducted from the resistive heating element to a conductive sheath surrounding the resistive heating element; ii) a time-domain profile of leakage current through the heating element insulation during a full power cycle; and/or iii) high-frequency components of the electrical current conducted by the resistive heating element and/or the voltage across the resistive heating element.

15 Claims, 8 Drawing Sheets

(51) Int. Cl.
*G01P 21/02* (2006.01)
*G01F 25/10* (2022.01)
*B64D 15/12* (2006.01)
*B64D 43/02* (2006.01)
*G01P 13/02* (2006.01)
*G01P 5/165* (2006.01)

(52) U.S. Cl.
CPC .............. *B64D 43/02* (2013.01); *G01F 25/10* (2022.01); *G01P 5/165* (2013.01); *G01P 13/025* (2013.01)

(58) Field of Classification Search
CPC .... G01R 31/58; G01R 31/2829; G01R 27/18; G01R 19/2513; G01R 19/16571; F01D 25/02; F01D 17/085; F01D 21/003; G01F 25/0007; G01F 1/46; G01P 5/165; G01P 13/025; G01P 21/025; G01P 5/14; G01P 5/16; G01P 21/00; B64D 15/12; B64D 2045/0085; B64D 45/00; B64D 43/02; B64D 15/20; B64D 43/00; H05B 3/56; H05B 1/0236; H05B 2214/02; H05B 3/44; H05B 1/0227; H05B 1/0269; H05B 1/0277; H05B 1/0291; H05B 2203/014; H05B 2203/02; H05B 3/46; H05B 3/48; H05B 6/062; G01K 13/028; G01K 15/007; B64F 5/60; B64F 5/00; G01L 19/0092; G01L 19/14; E04D 13/103; H01Q 1/02; G08B 21/182; G08B 21/185
See application file for complete search history.

(56) References Cited

U.S. PATENT DOCUMENTS

| | | | |
|---|---|---|---|
| 9,939,459 | B2 | 4/2018 | Dichek |
| 10,180,449 | B2 | 1/2019 | Essawy et al. |
| 10,197,517 | B2 | 2/2019 | Essawy et al. |
| 11,143,713 | B2* | 10/2021 | Kim ................. G01R 31/52 |
| 2016/0161541 | A1* | 6/2016 | Kim ................. G01R 31/1272 |
| | | | 702/58 |
| 2018/0275185 | A1* | 9/2018 | Essawy ............ B64D 43/02 |
| 2018/0299134 | A1* | 10/2018 | Lego ................ F24C 7/08 |
| 2019/0148928 | A1* | 5/2019 | Oms ................. H02H 1/003 |
| | | | 324/503 |
| 2019/0364618 | A1* | 11/2019 | Blum ................ H05B 6/062 |
| 2019/0382139 | A1 | 12/2019 | Shi |
| 2020/0072866 | A1* | 3/2020 | Gordon ............. G01P 21/00 |

OTHER PUBLICATIONS

Extended European Search Report dated Jul. 29, 2022, received for corresponding European Application No. 2216549.8, pp. 7.

* cited by examiner

US 11,762,040 B2

PREDICTING FAILURE AND/OR ESTIMATING REMAINING USEFUL LIFE OF AN AIR-DATA-PROBE HEATER

CROSS-REFERENCE TO RELATED APPLICATION(S)

This application is related to the following U.S. patent applications filed concurrently herewith: i) U.S. patent application Ser. No. 17/218,065, entitled "Air Data Probe Heater Failure Prediction," by Kaare Josef Anderson and Magdi A. Essawy; and ii) U.S. patent application Ser. No. 17/218,066, entitled "Air Data Probe Heater Failure Prediction," by Kaare Josef Anderson and Magdi A. Essawy. Both of the above cited and related U.S. patent applications are hereby incorporated by reference in their entirety.

BACKGROUND

Unexpected failures of air data probes, such as Pitot probes and total-air-temperature probes can lead to flight delays and related costs for aircraft operators. Air data probes typically include resistive heater elements to prevent operational issues relating to in-flight ice buildup. One of the most common types of failures in air data probes is failure of the resistive heating element. The ability to predict a future failure of the resistive heating element in air data probes would permit and facilitate pre-emptive maintenance to be performed without causing flight delays.

The heater element in an air data probe often consists of a resistive heater wire surrounded by an insulator and encapsulated within a metallic sheath. The insulator creates a very high electrical resistance between the metallic sheath (often electrically connected to the body of the probe) and the heater wire itself. The presence of the heater wire, insulator, and metallic sheath also creates a capacitance between the sheath and the heater wire. The combination of the insulation resistance and the wire-sheath capacitance creates a path for leakage current to flow from the heater wire to the sheath when a voltage is applied to the heating element.

SUMMARY

Apparatus and associated methods relate to a system for predicting failure and/or estimating remaining useful life of a resistive heating element of an air data probe. The system includes an electrical power source, an electrical sensor, a signal comparator and a remaining-life prediction engine. The electrical power source provides electrical operating power to the resistive heating element. The electrical sensor senses voltage and/or current of the electrical operating power provided to the resistive heating element. The signal comparator determines a phase relation of a leakage current with respect to the voltage and/or current of the electrical operating power provided to the resistive heating element. The remaining-life prediction engine estimates a remaining life of the resistive heating element based on the phase relation determined.

Some embodiments relate to a method for predicting failure of a resistive heating element of an air data probe. The method includes providing, via an electrical power source, electrical operating power to the resistive heating element. The method includes sensing, via an electrical sensor, voltage and/or current of the electrical operating power provided to the resistive heating element. The method includes determining, via a signal comparator, a phase relation of a leakage current with respect to the voltage and/or current of the electrical operating power provided to the resistive heating element. The method also includes estimating, via a remaining-life prediction engine, a remaining life of the resistive heating element based on the phase relation determined.

DETAILED DESCRIPTION

Apparatus and associated methods relate to predicting failure and/or estimating remaining useful life of an air-data-probe heater. Failure is predicted or useful life is estimated based on an electrical metric of the electrical operating power provided to a resistive heating element of the air-data-probe heater. The electrical metric of the air data probe heater is one or more of: i) phase relation between voltage across the resistive heating element and leakage current, which is conducted from the resistive heating element to a conductive sheath surrounding the resistive heating element; ii) a time-domain profile of leakage current through the heating element insulation during a full power cycle; and/or iii) high-frequency components of the electrical current conducted by the resistive heating element and/or the voltage across the resistive heating element.

Figure 1:
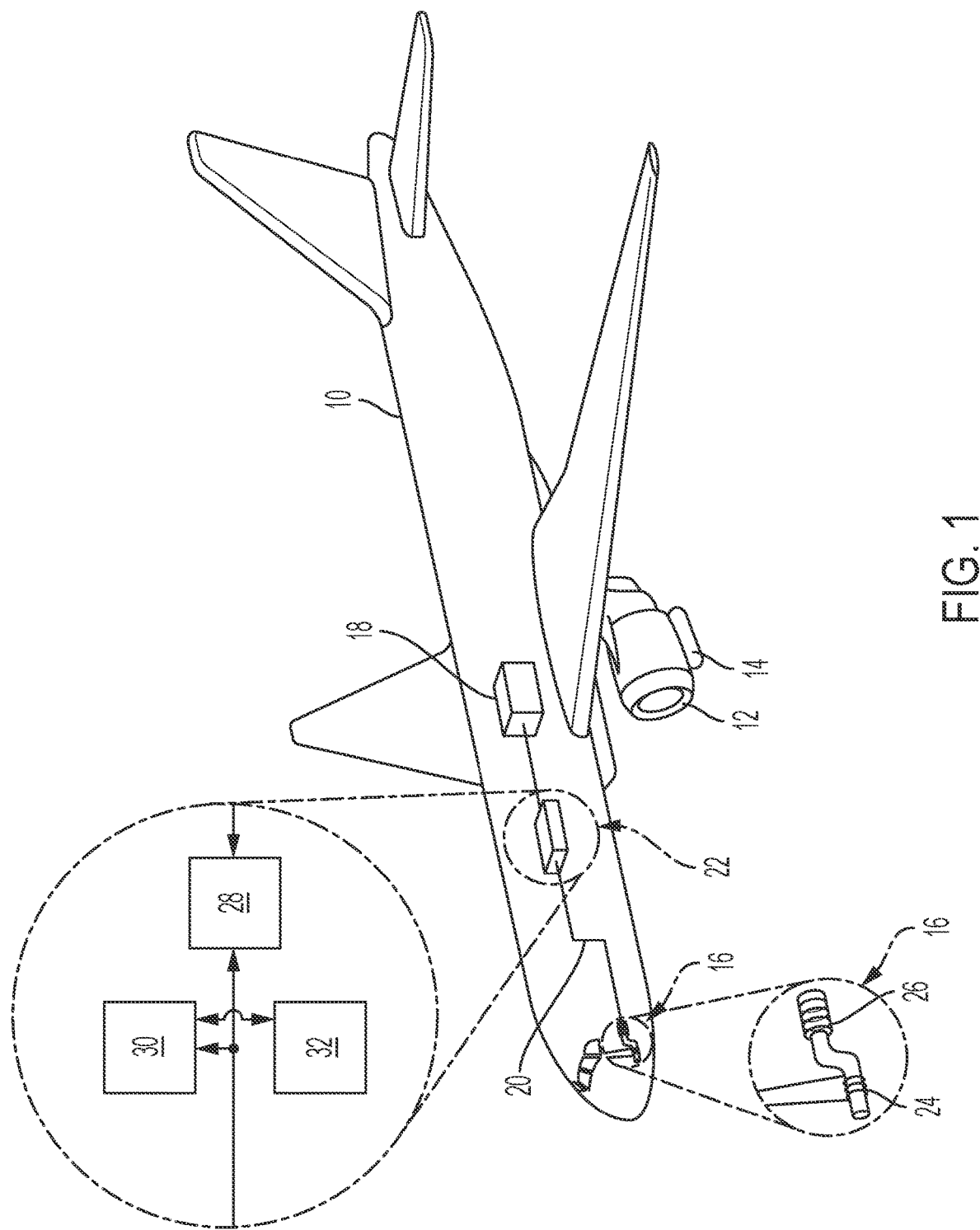
FIG. 1 is a schematic diagram of an aircraft equipped with a system for predicting failure and/or estimating remaining useful life of an air-data-probe heater.

FIG. 1 is a schematic diagram of an aircraft equipped with a system for predicting failure and/or estimating remaining useful life of an air-data-probe heater. In FIG. 1, aircraft 10 includes engine 12, which drives electrical generator 14 so as to provide electrical operating power to various powered electrical systems aboard aircraft 10. Aircraft 10 is also equipped with various air-data-probe sensors, including air-data-probe sensor 16. Air-data-probe sensor 16 is an electrical system powered by aircraft power distribution system 18. Air-data-probe sensor 16 receives operating power from aircraft power source 18 via electrical operating power cable 20. Aircraft 10 is also equipped with health monitoring system 22, which predicts failure and/or estimates remaining useful life of resistive heating element 24 of air-data-probe sensor 16. In the depicted embodiment, health monitoring system 22 is configured to predict failure and/or estimate remaining useful life of resistive heating element 24 based on an electrical metric of electrical operating power provided to resistive heating element 24.

Although health monitoring system 22 predicts failure and/or estimates remaining useful life of resistive heating element 24 for any of a variety of air-data-probe sensors, in the depicted embodiment, air-data-probe sensor 16 senses air pressure. Various air-data-probe sensors sense air pressure for the purpose of determining various air data metrics, such as airspeed, altitude, angle-of-attack, etc. In the depicted embodiment, air-data-probe sensor 16 is a Pitot tube airspeed detector that includes resistive heating element 24, and ram pressure air-data-probe sensor 26. Resistive heating element 24 is configured to prevent icing of air-data-probe sensor 16 when aircraft 10 is operating in an atmosphere in which ice accretion can occur.

Health monitoring system 22 includes electrical power source 28, electrical sensor 30, and remaining life prediction engine 32. Electrical power source 28 converts electrical power received from aircraft power source 18 into one or more different power configurations for use by air-data-probe sensor 16 and/or resistive heating element 24. Electrical sensor 30 is configured to sense an electrical metric of the operating power provided to resistive heating element 24. The electrical metric sensed by electrical sensor 30 is at least one of: i) phase relation between electrical current conducted from the resistive heating element to its surrounding conductive sheath and voltage across the resistive heating element; ii) a time-domain profile during a full power cycle of the leakage current conducted from the resistive heating element to its surrounding conductive sheath or the voltage across the resistive heating element; and/or iii) high-frequency components of the electrical current conducted by the resistive heating element and/or of the voltage across the resistive heating element.

Remaining life prediction engine 32 predicts failure and/or estimates remaining useful life of resistive heating element 24 based on the electrical metric sensed by electrical sensor 30. Each of the various electrical metrics described above can be indicative of health of resistive heating element 24. Each of these described electrical metrics with be further described below along with the relation these electrical metrics have with the health of resistive heating element 24, with reference to FIGS. 2-8.

Figure 2:
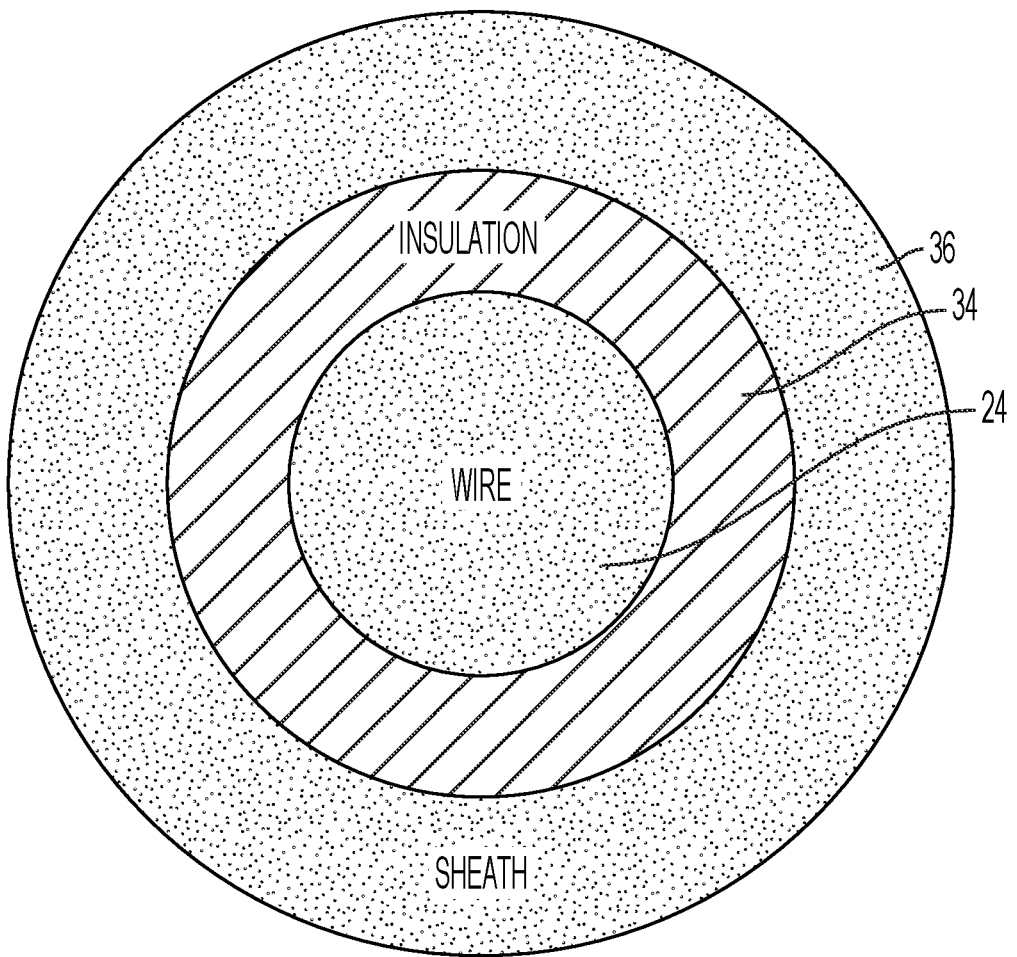
FIG. 2 is a graph of a cross-sectional diagram of a resistive heating element along with coaxial insulative material and a coaxial conductive sheath.

FIG. 2 is a graph of a cross-sectional diagram of a resistive heating element along with coaxial insulative material and a coaxial conductive sheath. Resistive heating element 24 is designed to have a particular resistance-temperature relation. The temperature of resistive heating element 24 can be determined based on a determination of electrical resistance of resistive heating element 24. For example, electrical resistance of resistive heating element 24 can be monotonically increasing with increasing temperature. For such a resistance-temperature relation, temperature of resistive heating element 24 is a function of resistance of resistive heating element 24. Coaxial insulative material 34 provides electrical insulation between resistive heating element 24 and surrounding coaxial conductive sheath 36. Such electrical insulation permits resistive heating element 24 to be electrically biased independently of coaxial conductive sheath 36, which is typically grounded.

Figure 3:
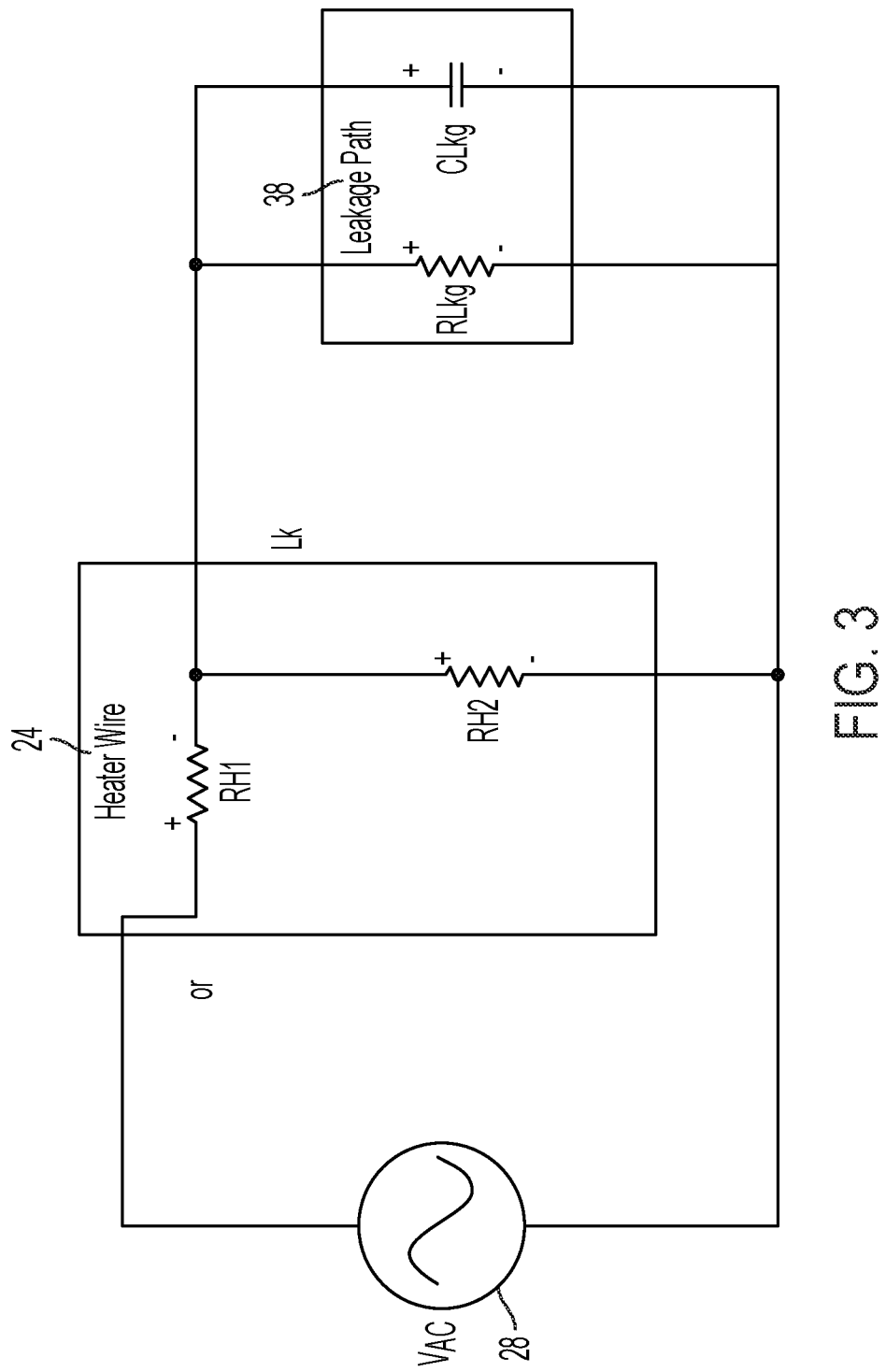
FIG. 3 is simplified schematic circuit demonstrating leakage behavior of a resistive heating element biased by an electrical power source.

FIG. 3 is simplified schematic circuit demonstrating leakage behavior of a resistive heating element biased by an electrical power source. In FIG. 3, electrical power source 28 provides operating power to resistive heating element 24. Resistive heating element 24 has leakage path 38 at a particular location along a length of resistive heating element 24. Simplified lumped parameter model of resistive heating element 24 has portions on either side of the particular location along its length, as represented by first heating resistor $R_{H1}$ and second heating resistor $R_{H2}$. Although only one leakage path is depicted, every section of resistive heating element 24 can be modeled with such a leakage path. Leakage path 38 is modeled as leakage resistance $R_{LKG}$ in parallel with leakage capacitance $C_{LKG}$.

Values of leakage resistance $R_{LKG}$ and leakage capacitance $C_{LKG}$ can change over time for a variety of reasons. For example, coaxial insulative material 24 (depicted in FIG. 2) can degrade, providing increased conductivity and/or changed capacitive coupling between resistive heating element 24 and surrounding coaxial conductive sheath 36. These two mechanisms—increased conductivity and/or increased capacitive coupling—are represented as leakage resistor $R_{LKG}$ and leakage capacitor $C_{LKG}$, respectively. The primary mechanism in response to degradation of insulative material 34 is increased conductivity (i.e., reduced leakage resistance $R_{LKG}$). As leakage resistance $R_{LKG}$ decreases (e.g., due to degradation of insulative material 34), the character of the leakage path changes from being mostly capacitive to more resistive.

Changes to leakage resistance $R_{LKG}$ and/or leakage capacitance $C_{LKG}$ of leakage path 38 changes the electrical behavior of resistive heating element 24. When the leakage path is mostly capacitive (e.g., when insulative material is undegraded), resistive heating element 24 and coaxial conductive sheath 36 are mostly capacitively coupled to one another (i.e., $R_{LKG}$ is very large). Thus, the phase relation between the leakage current and the voltage across resistive heating element 24 will be mostly out of phase (e.g., about 90 degrees). For capacitive coupling, the electrical current leads the voltage. But when a short develops between resistive heating element 24 and coaxial conductive sheath 36, the phase angle will become less out of phase, as the coupling between resistive heating element 24 and coaxial conductive sheath 36, becomes more conductive (i.e., leakage resistance $R_{LKG}$ become smaller) and less capacitive.

Figure 4A:
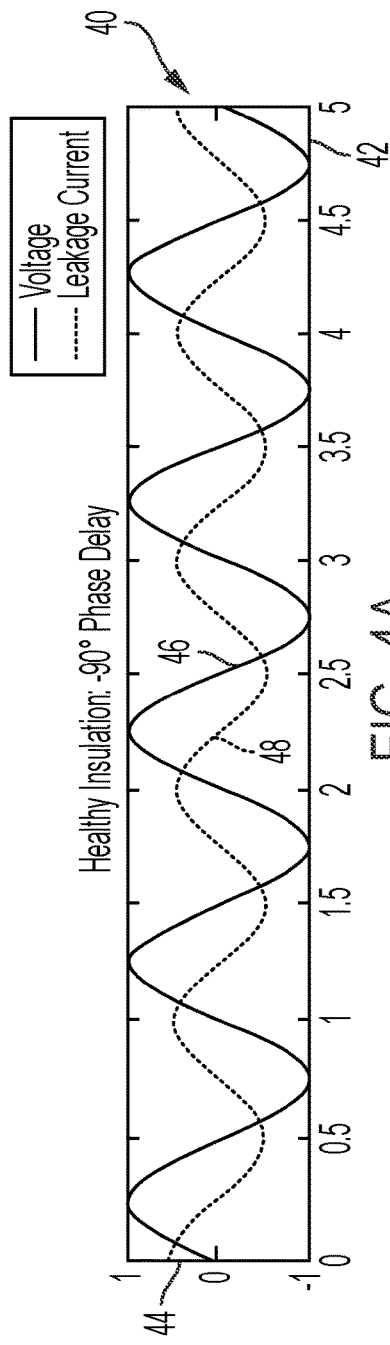
FIGS. 4A-4C are graphs of leakage current and AC electrical voltage of operating power provided to a resistive heating element, for various health conditions of a resistive heating element.
Figure 4B:
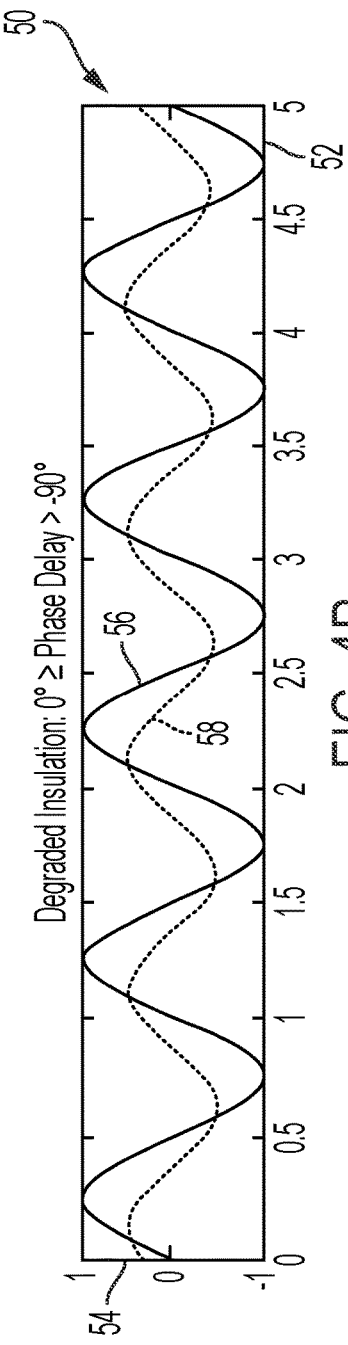
Figure 4C:
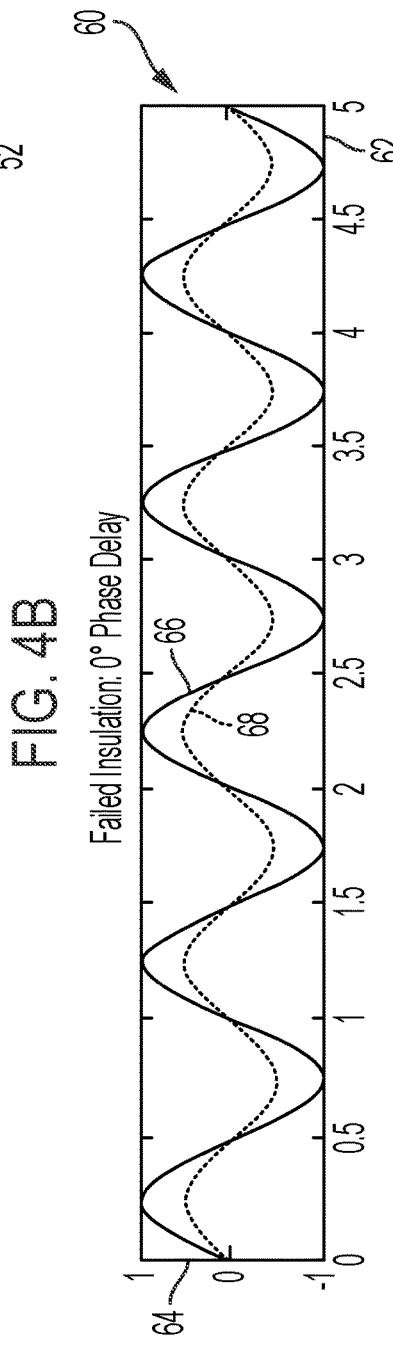

FIGS. 4A-4C are graphs of AC electrical voltage of operating power provided to a resistive heating element and leakage current, for various health conditions of a resistive heating element. In FIG. 4A, graph 40 includes horizontal axis 42, vertical axis 44, voltage-time relation 46, and current-time relation 48. Horizontal axis 42 is indicative of time. Vertical axis 44 is indicative of voltage and leakage current. Voltage-time relation 46 depicts temporal behavior of voltage across resistive heating element 24 (as depicted in FIG. 3). In the depicted voltage-time relation, electrical power source 28 provides AC operating power to resistive heating element 24. In FIG. 4A, leakage current-time relation 48 is mostly out of phase with voltage-time relation 46. Leakage current-time relation 48 leads voltage-time relation 46 by about 90 degrees. Such a relation occurs when leakage capacitor $C_{LKG}$ is quite large as compared to the resistive path (e.g., the impedance associated with leakage capacitor $C_{LKG}$ is a dominant contributor to the leakage current at the frequency of the AC operating power—the insulation resistance in this case is quite large and has much smaller contribution to leakage current). Such a phase relation is indicative of little or no degradation of insulative material 34.

In FIG. 4B, graph 50 includes horizontal axis 52, vertical axis 54, voltage-time relation 56, and leakage current-time relation 58. Horizontal axis 52 is again indicative of time. Vertical axis 54 is again indicative of voltage and leakage current. Voltage-time relation 56 depicts temporal behavior of voltage across resistive heating element 24 (as depicted in FIG. 3). In the depicted voltage-time relation, electrical power source 28 provides AC operating power to resistive heating element 24. In FIG. 4B, leakage current-time relation 58 is not in phase with voltage-time relation 56. Leakage current-time relation 58 leads voltage-time relation 56 by about 45 degrees. Such a relation can occur when the impedance of leakage capacitor $C_{LKG}$ is comparable to impedance of the leakage resistor $R_{LKG}$ at frequency of the AC operating power. Such a phase relation is indicative of some degradation of insulative material 34.

In FIG. 4C, graph 60 includes horizontal axis 62, vertical axis 64, voltage-time relation 66, and leakage current-time relation 68. Horizontal axis 62 is again indicative of time. Vertical axis 64 is again indicative of voltage and leakage current. Voltage-time relation 66 depicts temporal behavior of voltage across resistive heating element 24 (as depicted in FIG. 3). In the depicted voltage-time relation, electrical power source 28 provides AC operating power to resistive heating element 24. In FIG. 4C, leakage current-time relation 48 is mostly in phase with voltage-time relation 66. Such a relation occurs when insulative material 34 becomes compromised (e.g., very thin or non-existent in places).

Temperature also affects the phase relation of the electrical current and the voltage for a degraded resistive heating element. Such a temperature dependency can occur for a variety of reasons. For example, as resistive heating element 24 heats up, leakage conductance (i.e., inverse of $R_{LKG}$) can decrease as moisture is driven away out of coaxial insulative material 34. This decrease in leakage conductance $1/R_{LKG}$ can cause the phase relation between leakage current and voltage across resistive heating element 24 to become somewhat more out of phase (e.g., between a 10 and 30 degree change from its initial cold temperature phase relation). Also, a temperature dependency can occur because the insulative quality of insulative material 34 can change as a function of temperature. Thus, understanding the normal temperature dependency of the leakage current-voltage phase relation can help one to identify when such a phase relation is abnormal.

Figure 5:
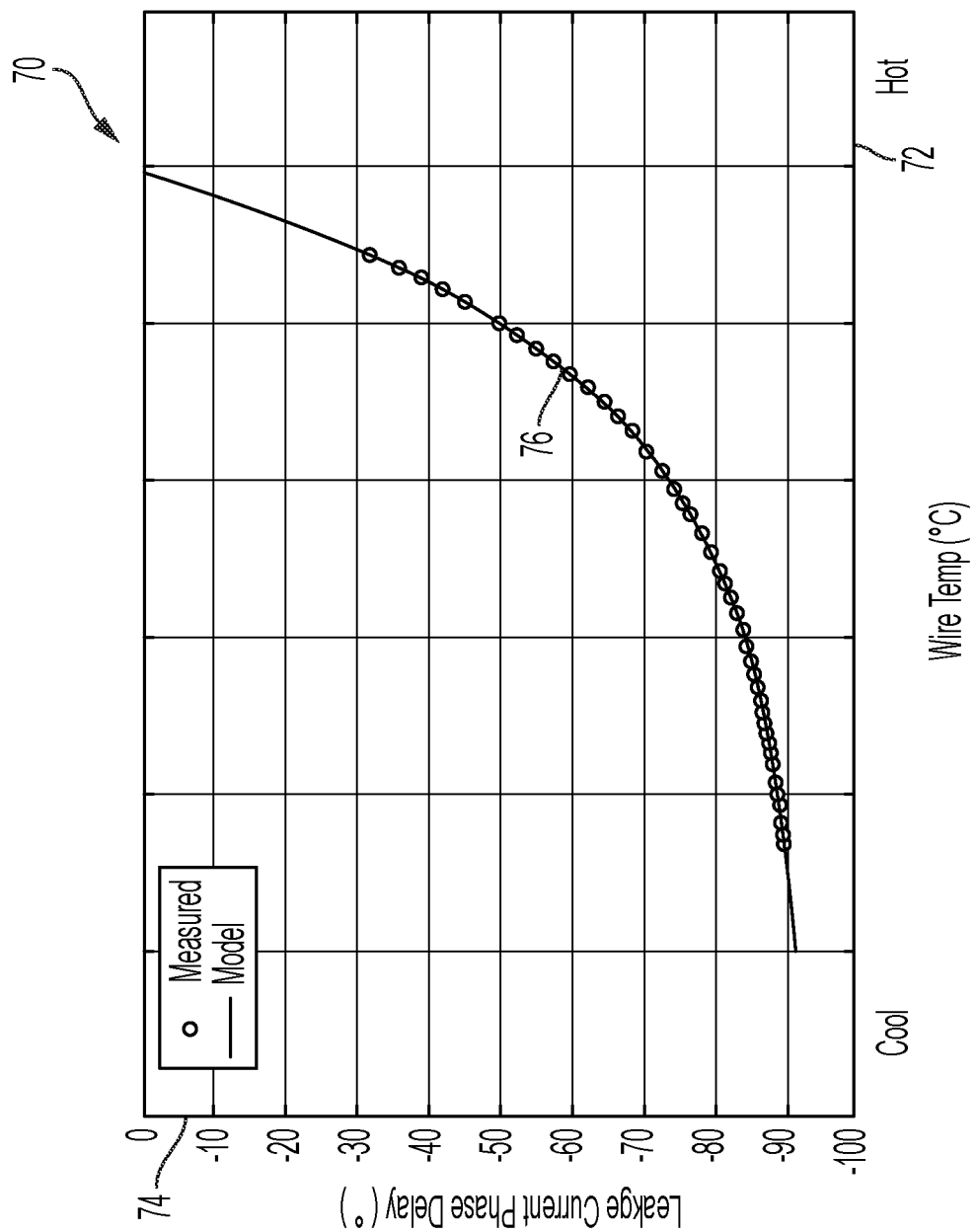
FIG. 5 is a graph of leakage current to voltage phase relationship at the operating power provided to a resistive heating element as a function of temperature.

FIG. 5 is a graph of leakage current to voltage phase relationship at the operating power provided to a resistive heating element as a function of temperature. In FIG. 5, graph 70 includes horizontal axis 72, vertical axis 74, and leakage current-voltage phase relation 76. Horizontal axis 72 is indicative of temperature. Vertical axis 74 is indicative of phase delay angle of the leakage current with regard to the voltage of the operating power provided to resistive heating element 24 (depicted in FIG. 2). Leakage current-voltage phase relation 76 indicates that at low temperatures, the electrical current is delayed by about −90 degrees (i.e., the electrical current leads the voltage by about 90 degrees). As temperature increases, the phase delay of the leakage current increases (i.e., decreases in negative magnitude). Such a large change in phase relation is indicative of a probe, in which insulative material 34 has been degraded. For a healthy probe, changes in the phase relation due to heating of resistive heating element is typically modest (e.g., between 10 and 30 degrees). At very hot temperatures, the phase delay of the leakage current crosses zero degrees for the resistive heating element with degraded insulative material, as depicted in the figure. Because heating of the resistive heating element can cause some phase relation change, some embodiments of health monitoring system 22 use leakage current-voltage phase data acquired at a predetermined standard temperature. Other embodiments of health monitoring system 22 compare measurements of leakage current-voltage phase data with a known predetermined leakage current-voltage phase relation, such as, for example, leakage current-voltage phase relation 76.

Figure 6:
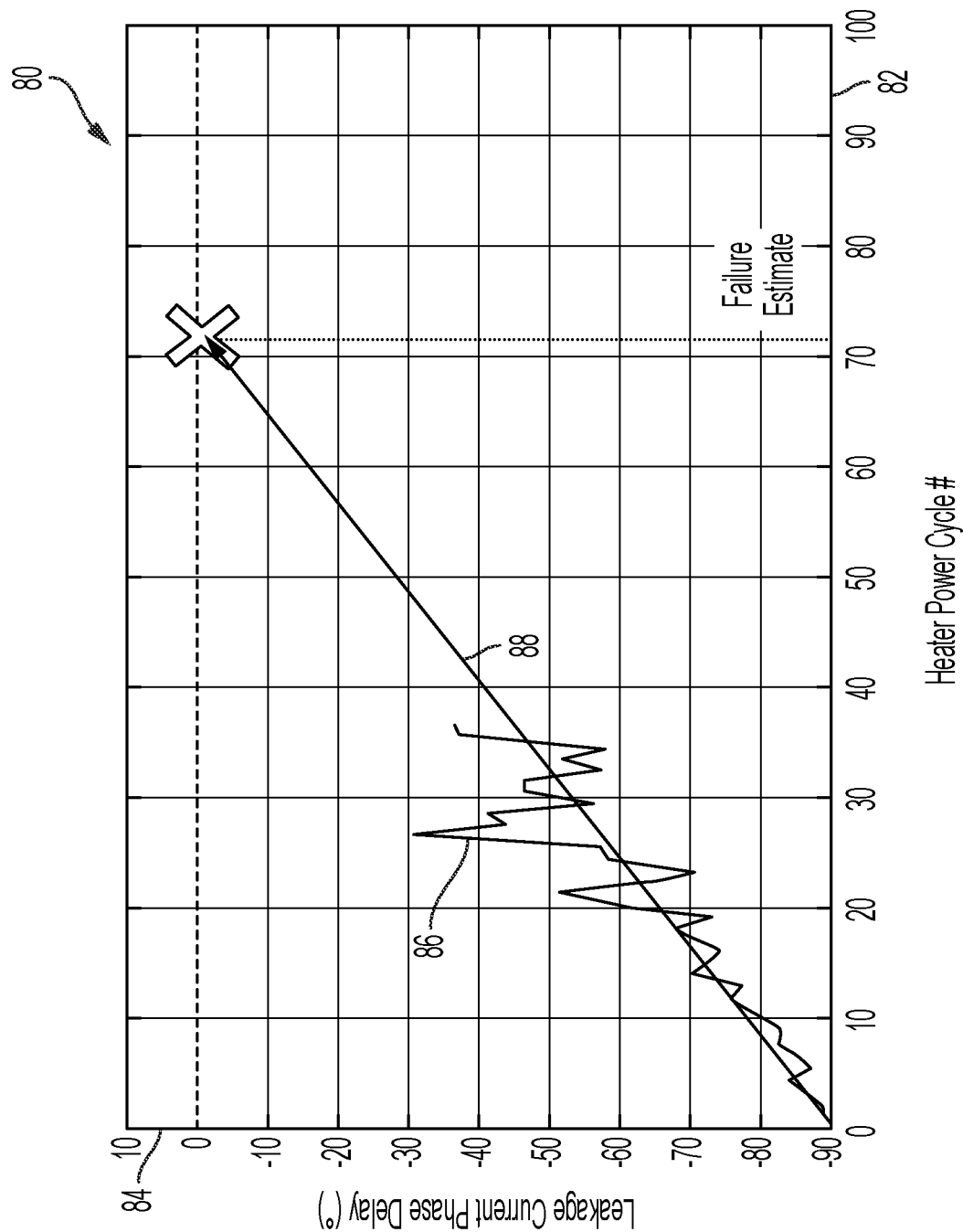
FIG. 6 is a graph of leakage current phase delay data acquired over a lifetime of a resistive heating element.

FIG. 6 is a graph of leakage current phase delay data acquired over a lifetime of a resistive heating element. In FIG. 6, graph 80 includes horizontal axis 82, vertical axis 84, leakage current data 86 and leakage current projection 88. Horizontal axis 82 is indicative of heater power cycle number. Vertical axis 84 is indicative of leakage current phase delay. Every time that the resistive heating element 24 is power cycled (i.e., turned on and operated), data is collected at a predetermined operating temperature, as the temperature of resistive heating element 24 crosses that predetermined operating temperature. This acquired data is represented on graph 80 as leakage current data 86. A trend line is fit to leakage current data 86 and projected as leakage current phase delay projection 88 on graph 80. The number of remaining power cycles before leakage current phase delay projection 88 crosses a predetermined threshold can indicate a remaining useful life of resistive heating element 24. In the depicted embodiment, predetermined threshold is zero degrees, but such a threshold need not be zero degrees, depending on the lifetime testing margin of the particular embodiment.

Figure 7:
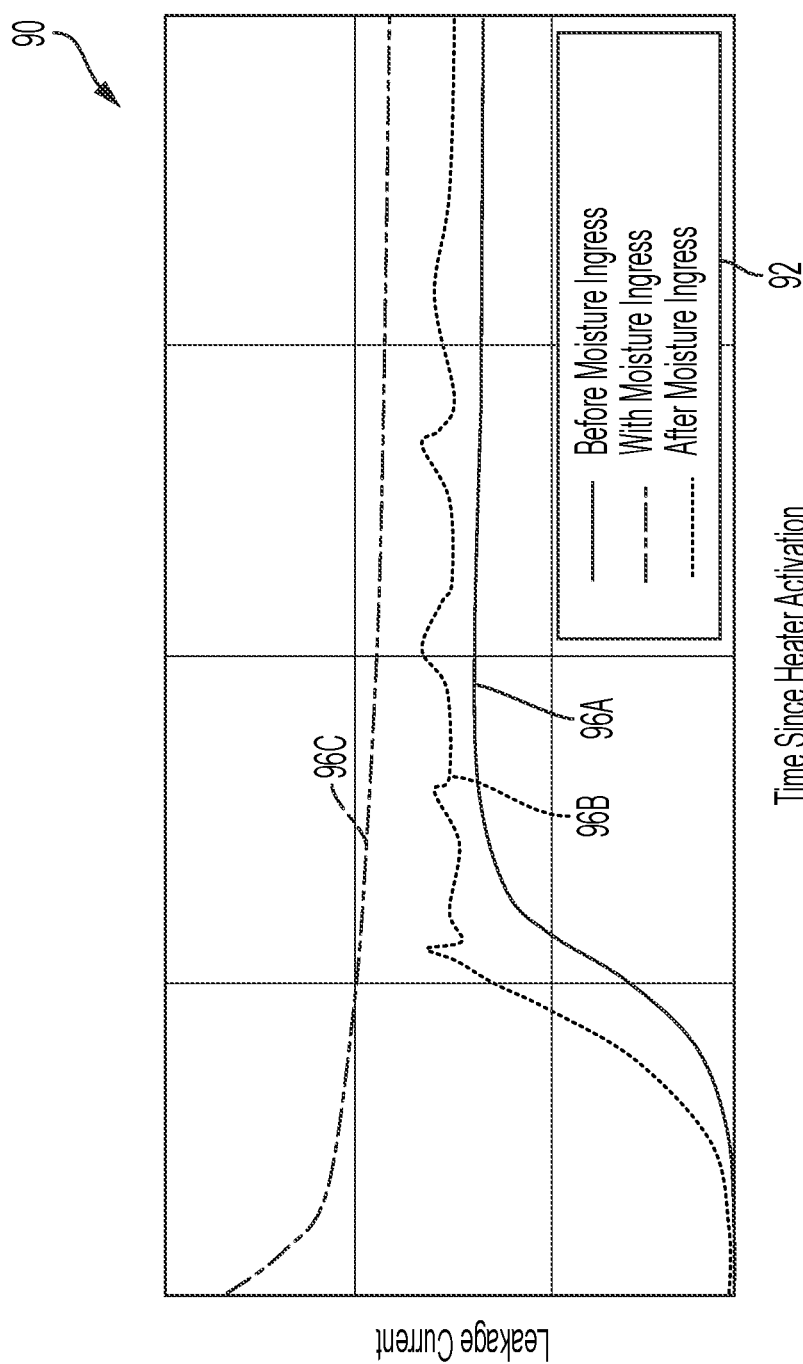
FIG. 7 is a graph of various start up behaviors for leakage current of operating power provided to a resistive heating element.

Instead of predicting failure and/or estimating remaining useful life of a resistive heating element based on leakage current-voltage phase of the operating power provided thereto, some embodiments predict failure and/or estimate remaining useful life of a resistive heating element based on temporal startup behavior of electrical metrics of the operating power. FIG. 7 is a graph of various start up behaviors for leakage current from a resistive heating element. In FIG. 7, graph 90 includes horizontal axis 92, vertical axis 94, and leakage current-time relations 96A-96C. Horizontal axis 92 is indicative of time measured from initial provision of power to resistive heating element 24. Vertical axis 94 is indicative of leakage current measured between resistive heating element 24 and coaxial conductive sheath 38. In the depicted voltage-time relation, electrical power source 28 provides AC operating power to resistive heating element 24. In such AC embodiments, RMS values of current and power can be monitored and start up behavior of these monitored electrical metrics are indicative of health of coaxial conductive sheath 36 and/or coaxial insulative material 34. An increase in leakage current exhibitions of noise fluctuations can indicate a presence of moisture, thus indicating damage to either coaxial conductive sheath 36 and/or coaxial insulative material 34. In some embodiments, DC operating power is provided to resistive heating element 24. Such leakage current can have start-up behavior that varies in response to health condition and in response to presence or absence of moisture. Current-time relations 96A-96C represent leakage current of resistive heating element 24 as measured at start-up time for three consequent start-up cycles representing different moisture content conditions that range from moisture to less moisture to no moisture.

Coaxial conductive sheath 36 is configured to provide a physical barrier between resistive heating element 24 and coaxial insulative material 32 from the atmospheric environment. Moisture in the atmospheric environment can cause degradation to each of coaxial insulative material 32 and resistive heating element 24, should such elements be exposed to moisture in the atmosphere. The integrity of the barrier presented by coaxial conductive sheath 36 can become compromised with age, though. And should coaxial conductive sheath 36 become compromised, leakage currents can increase as a result of degradation (e.g., thinning, cracking, etc.) of coaxial insulative material 34. Such degradation can be due to a compromised coaxial conductive sheath 36, which, when compromised, can permit the ingress of moisture into coaxial insulative material 34 and resistive heating element 24. Current-time relation 96A represents the power-cycle leakage current profile for resistive heating element 24 before moisture ingress into coaxial insulative material 34 and/or resistive heating element 24. Current-time relation 96C represents the start-up leakage current profile for resistive heating element 24 after moisture ingress into coaxial insulative material 34 and/or resistive heating element 24. Such moisture ingress assists the conduction of electrical currents, thereby increasing the level of leakage current until thermal heating element 34 heats up enough to drive away the moisture present. The steady-state current asymptote is higher for current-time relation 96C than the steady-state current asymptote for current-time relation 96A. Current-time relation 96B represents the power-cycle leakage current profile for resistive heating element 24 after moisture ingress into coaxial insulative material 34 and/or resistive heating element 24 (e.g., after the moisture has been driven out of coaxial insulative material 34 by temperatures generated by resistive heating element 24). The steady-state current asymptote remains higher for current-time relation 96B than the steady-state current asymptote for current-time relation 96A. Furthermore, there are some high-frequency spikes superimposed upon current-time relation 96B, which are not exhibited in current-time relation 96A.

Figure 8:
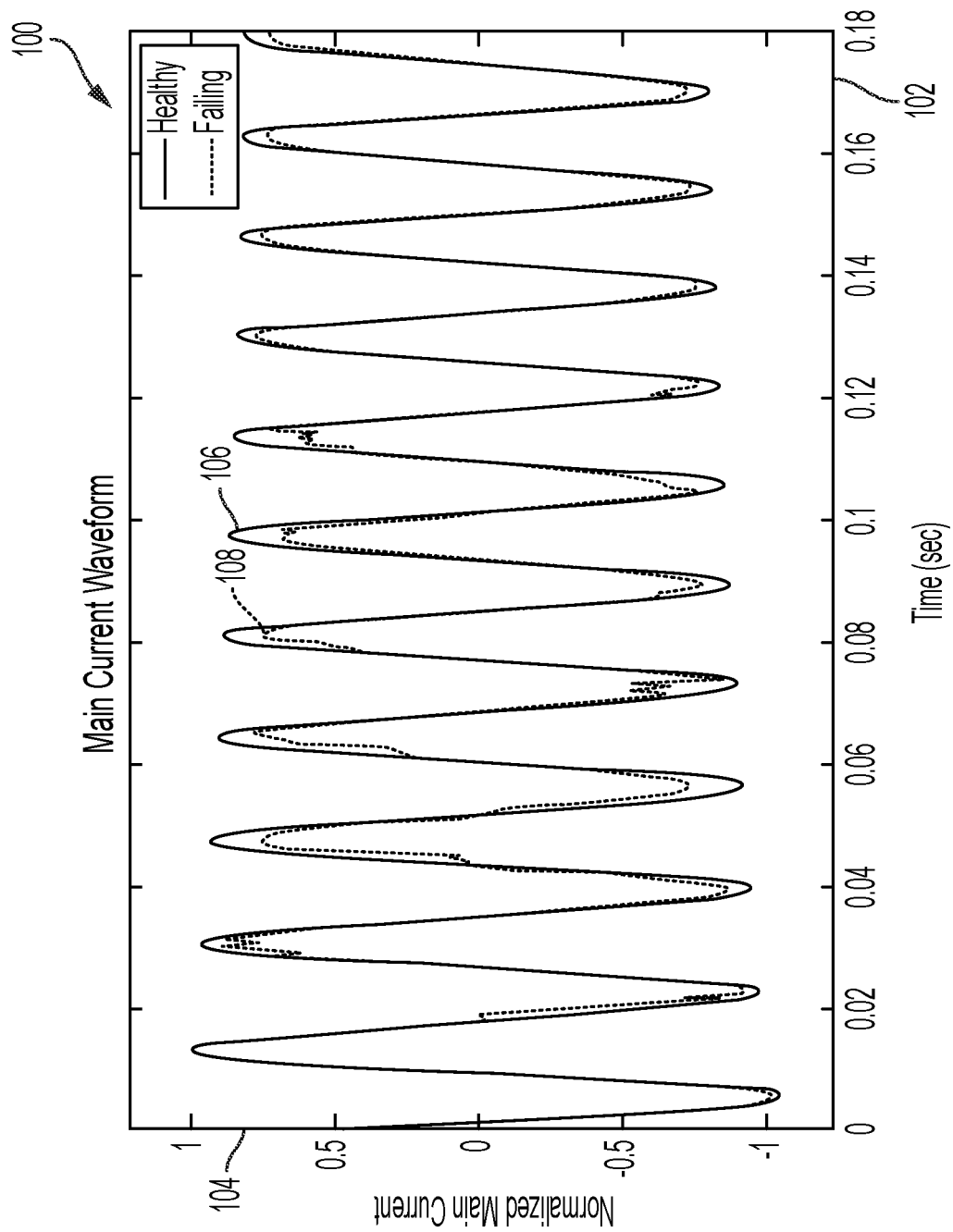
FIG. 8 is a graph of high-frequency noise in the AC electrical current provided to a resistive heating element showing degradation.

Another way to estimate remaining useful life of a resistive heating element is to detect high-frequency signal components that are indicative of compromised integrity of coaxial insulative material 34 and/or resistive heating element 24. FIG. 8 is a graph of high-frequency noise in AC electrical currents provided to a resistive heating element showing degradation. In FIG. 8, graph 100 includes horizontal axis 102, vertical axis 104, and electrical current-time relations 106 and 108. Horizontal axis 102 is indicative of time. Vertical axis 104 is indicative of amplitude of electrical current of operating power provided to resistive heating element 24. Electrical current-time relation 106 depicts temporal behavior of electrical current of the operating power provided to resistive heating element 24 (as depicted in FIG. 3), for a resistive heating element with healthy insulative material 34. In the depicted electrical current-time relation, electrical power source 28 provides AC operating power to resistive heating element 24. Electrical current-time relation 108 depicts temporal behavior of electrical current of the operating power provided to resistive heating element 24 (as depicted in FIG. 3), for a resistive heating element with degraded insulative material 34. The main difference between electrical current-time relation 106 and electrical current-time relation 108 is the high-frequency behavior (i.e., at frequencies high in comparison with the frequency of the AC operating power). Electrical current-time relation 108 has discernable high-frequency noise superimposed on the AC signal, whereas electrical current-time relation 106 has no discernable high-frequency noise. Such high-frequency noise can be indicative of a corroded resistive heating element 24. Current-time relation 108 has such high-frequency components indicative of degradation (e.g., micro cracks) of resistive heating element 24 superimposed on the AC current waveform.

High-frequency components in current-time relation 108 can be caused by other factors as well. For example, any high-frequency components in voltage of the operating power provided to resistive heating element 24 will be replicated in current-time relation 106 for resistive heating element 34 that are not degraded. Therefore, sensing high-frequency components of both voltage-time relation 106 and current-time relation 108 can be used to determine if such components are present in but one of the two electrical metrics. For example, a ratio can be made of the high-frequency components of current-time relation 108 to the high-frequency components of voltage of operating power provided to resistive heating element 24. Then, such a ratio can be compared with a predetermined threshold value. If the ratio is greater than the predetermined threshold value, remaining life prediction engine 32 can generate a signal indicative of the event. A log of such incidences of such a comparison can be maintained. Remaining useful life can be determined based on such a log.

Such high-frequency components can be sensed, for example, by taking a derivative of voltage of operating power provided to resistive heating element 24 and/or current-time relation 108. The operation of taking the derivative amplifies high-frequency components above lower-frequency components. A ratio of the derivatives of the current-time relation and the voltage-time relation can then be compared with a predetermined threshold. If the ratio is greater than the predetermined threshold, such a comparison can be indicative of micro cracks in resistive heating element 24. Remaining life prediction engine 32 can make such calculations (e.g., take the derivatives, calculate the ratio, and make the comparison, etc.) in various ways. For example, remaining life prediction engine 32 can include a processor, a programmable logic array, or any other type of programmable device. In some embodiments, remaining life prediction engine 32 can be configured to perform all of the operations using discrete circuitry.

Discussion of Possible Embodiments

The following are non-exclusive descriptions of possible embodiments of the present invention.

Apparatus and associated methods relate to a system for predicting failure and/or estimating remaining useful life of a resistive heating element of an air data probe. The system includes an electrical power source, an electrical sensor, a signal comparator and a remaining-life prediction engine. The electrical power source provides electrical operating power to the resistive heating element. The electrical sensor senses voltage and/or current of the electrical operating power provided to the resistive heating element. The signal comparator determines a phase relation of a leakage current with respect to the voltage and/or current of the electrical operating power provided to the resistive heating element. The remaining-life prediction engine estimates a remaining life of the resistive heating element based on the phase relation determined.

The system of the preceding paragraph can optionally include, additionally and/or alternatively, any one or more of the following features, configurations and/or additional components:

A further embodiment of the foregoing system, wherein the remaining-life prediction engine can estimate the remaining life of the resistive heating element by estimating a remaining time that electrical operating power can be provided to the resistive heating element until the phase relation determined will cross a predetermined phase relation threshold.

A further embodiment of any of the foregoing systems, wherein the remaining-life prediction engine can compute an element temperature of the heating element based, at least in part, on the electrical operating power provided to the resistive heating element.

A further embodiment of any of the foregoing systems can further include a timer for marking time of operation of the heating element from an initial operating time when the electrical operating power is initially provided to the resistive temperature sensor. The remaining-life prediction engine can compute the element temperature based, at least in part, on the time of operation of the heating element marked.

A further embodiment of any of the foregoing systems, wherein the remaining-life prediction engine can compare the element temperature computed with a predetermined temperature threshold.

A further embodiment of any of the foregoing systems, wherein the remaining-life prediction engine can estimate a remaining life of the resistive heating element based on the phase relation determined when the element temperature computed is within a delta temperature range of the predetermined temperature threshold.

A further embodiment of any of the foregoing systems, wherein the remaining-life prediction engine can estimate a remaining life of the resistive heating element based on the phase relation falling below a phase difference of 45°.

A further embodiment of any of the foregoing systems, wherein the electrical sensor is a first electrical sensor. The system can further include a second electrical sensor that senses the leakage current.

A further embodiment of any of the foregoing systems, wherein the second electrical sensor can sense the leakage current between the resistive heating element and a conductive sheath surrounding the electrical heating element.

A further embodiment of any of the foregoing systems, wherein the leakage current can be sensed when the element temperature computed either crosses or is within a delta temperature range of the predetermined temperature threshold is logged in a leakage-current log.

A further embodiment of any of the foregoing systems, wherein the remaining-life prediction engine can estimate the remaining life of the resistive heating element based on a projection curve of the leakage-current log.

A further embodiment of any of the foregoing systems, wherein the remaining-life prediction engine can estimate the remaining life as being the remaining time that electrical operating power can be provided to the resistive heating element at which the projection curve will cross a leakage threshold.

Some embodiments relate to a method for predicting failure of a resistive heating element of an air data probe. The method includes providing, via an electrical power source, electrical operating power to the resistive heating element. The method includes sensing, via an electrical sensor, voltage and/or current of the electrical operating power provided to the resistive heating element. The method includes determining, via a signal comparator, a phase relation of a leakage current with respect to the voltage and/or current of the electrical operating power provided to the resistive heating element. The method also includes estimating, via a remaining-life prediction engine, a remaining life of the resistive heating element based on the phase relation determined.

The method of the preceding paragraph can optionally include, additionally and/or alternatively, any one or more of the following features, configurations and/or additional components:

A further embodiment of the foregoing method, wherein estimating the remaining life of the resistive heating element can include estimating a remaining time that electrical operating power can be provided to the resistive heating element until the phase relation determined will cross a predetermined phase relation threshold.

A further embodiment of any of the foregoing methods can further include computing, via the remaining-life prediction engine, an element temperature of the heating element based, at least in part, on the electrical operating power provided to the resistive heating element.

A further embodiment of any of the foregoing methods can further include marking, via a timer, time of operation of the heating element from an initial operating time when the electrical operating power is initially provided to the resistive temperature sensor. The remaining-life prediction engine can compute the element temperature based, at least in part, on the time of operation of the heating element marked.

A further embodiment of any of the foregoing methods can further include comparing, via the remaining-life prediction engine, the element temperature computed with a predetermined temperature threshold.

A further embodiment of any of the foregoing methods, wherein estimating the remaining life of the resistive heating element includes estimating a remaining life of the resistive heating element based on the phase relation determined when the element temperature computed is within a delta temperature range of the predetermined temperature threshold.

A further embodiment of any of the foregoing methods, wherein the electrical sensor is a first electrical sensor, the method further incudes sensing, via a second electrical sensor, the leakage current between the resistive heating element and a conductive sheath surrounding the electrical heating element.

A further embodiment of any of the foregoing methods can further include logging, into a leakage-current log, the leakage current sensed when the element temperature computed either crosses or is within a delta temperature range of the predetermined temperature threshold.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for predicting failure and/or estimating remaining useful life of a resistive heating element of an air data probe, the system comprising:
   an electrical power source that provides AC electrical operating power to the resistive heating element during normal operation of the air data probe;
   a first electrical sensor that senses AC voltage and/or AC current of the AC electrical operating power provided to the resistive heating element;
   a second electrical sensor that senses AC leakage current between the resistive heating element and a conductive sheath surrounding the electrical heating element;

a signal comparator that determines a phase relation between the AC leakage current as sensed by the second electrical sensor and the AC voltage and/or AC current of the AC electrical operating power provided to the resistive heating element as sensed by the first electrical sensor; and a remaining-life prediction engine that estimates a remaining life of the resistive heating element based on the phase relation determined, wherein the remaining-life prediction engine estimates the remaining life of the resistive heating element based on the phase relation determined when an element temperature computed is within a delta temperature range of a predetermined temperature threshold.

2. The system of claim 1, wherein the remaining-life prediction engine estimates the remaining life of the resistive heating element by estimating a remaining time that AC electrical operating power can be provided to the resistive heating element until the phase relation determined will cross a predetermined phase relation threshold.

3. The system of claim 1, wherein the remaining-life prediction engine computes the element temperature of the heating element based, at least in part, on the AC electrical operating power provided to the resistive heating element.

4. The system of claim 3, further comprising:
a timer for marking time of operation of the heating element from an initial operating time when the AC electrical operating power is initially provided to the resistive temperature sensor,
wherein the remaining-life prediction engine computes the element temperature based, at least in part, on the time of operation of the heating element marked.

5. The system of claim 3, wherein the remaining-life prediction engine compares the element temperature computed with the predetermined temperature threshold.

6. The system of claim 3, wherein the remaining-life prediction engine estimates the remaining life of the resistive heating element based on the phase relation falling below a phase difference of 45°.

7. The system of claim 1, wherein the AC leakage current is sensed when the element temperature computed either crosses or is within a delta temperature range of the predetermined temperature threshold, and the AC leakage current sensed is logged in a leakage-current log.

8. The system of claim 7, wherein the remaining-life prediction engine estimates the remaining life of the resistive heating element based on a projection curve of the leakage-current log.

9. The system of claim 8, wherein the remaining-life prediction engine estimates the remaining life as being the remaining time that AC electrical operating power can be provided to the resistive heating element at which the projection curve will cross a leakage threshold.

10. A method for predicting failure of a resistive heating element of an air data probe, the method comprising:
providing, via an electrical power source, AC electrical operating power to the resistive heating element;
sensing, via a first electrical sensor, AC voltage and/or AC current of the AC electrical operating power provided to the resistive heating element;
sensing, via a second electrical sensor, AC leakage current between the resistive heating element and a conductive sheath surrounding the electrical heating element;
determining, via a signal comparator, a phase relation between the AC leakage current as sensed by the second electrical sensor and the AC voltage and/or AC current of the AC electrical operating power provided to the resistive heating element as sensed by the first electrical sensor; and
estimating, via a remaining-life prediction engine, a remaining life of the resistive heating element based on the phase relation determined, wherein estimating the remaining life of the resistive heating element is based on the phase relation determined when the element temperature computed is within a delta temperature range of a predetermined temperature threshold.

11. The method of claim 10, wherein estimating the remaining life of the resistive heating element comprises:
estimating a remaining time that AC electrical operating power can be provided to the resistive heating element until the phase relation determined will cross a predetermined phase relation threshold.

12. The method of claim 10, further comprising:
computing, via the remaining-life prediction engine, the element temperature of the heating element based, at least in part, on the AC electrical operating power provided to the resistive heating element.

13. The method of claim 12, further comprising:
marking, via a timer, time of operation of the heating element from an initial operating time when the AC electrical operating power is initially provided to the resistive temperature sensor,
wherein the remaining-life prediction engine computes the element temperature based, at least in part, on the time of operation of the heating element marked.

14. The method of claim 12, further comprising:
comparing, via the remaining-life prediction engine, the element temperature computed with the predetermined temperature threshold.

15. The method of claim 10, further comprising:
logging, into a leakage-current log, the AC leakage current sensed when the element temperature computed either crosses or is within a delta temperature range of the predetermined temperature threshold.

* * * * *